US009269535B1

(12) United States Patent
Hwang et al.

(10) Patent No.: US 9,269,535 B1
(45) Date of Patent: Feb. 23, 2016

(54) ION BEAM SOURCE

(71) Applicant: FINE SOLUTION CO., LTD., Gyeonggi-do (KR)

(72) Inventors: Yun Seok Hwang, Seoul (KR); Yun Sung Huh, Gyeonggi-do (KR)

(73) Assignee: FINE SOLUTION CO., LTD., Gyeonggi-do (KR)

( * ) Notice: Subject to any disclaimer, the term of this patent is extended or adjusted under 35 U.S.C. 154(b) by 0 days.

(21) Appl. No.: 14/923,363

(22) Filed: Oct. 26, 2015

Related U.S. Application Data

(63) Continuation of application No. PCT/KR2014/003683, filed on Apr. 25, 2014.

(30) Foreign Application Priority Data

| Apr. 26, 2013 | (KR) | 10-2013-0046947 |
| Jun. 13, 2013 | (KR) | 10-2013-0067501 |
| Oct. 31, 2013 | (KR) | 10-2013-0131434 |
| Apr. 7, 2014 | (KR) | 10-2014-0041227 |

(51) Int. Cl.
*H01J 37/08* (2006.01)
*H01J 37/30* (2006.01)

(52) U.S. Cl.
CPC .................... *H01J 37/30* (2013.01)

(58) Field of Classification Search
USPC ........................ 250/423 R, 426, 427
See application file for complete search history.

(56) References Cited

U.S. PATENT DOCUMENTS

| 6,750,600 | B2 | 6/2004 | Kaufman et al. |
| 6,815,690 | B2 | 11/2004 | Veerasamy et al. |
| 6,870,164 | B1 | 3/2005 | Baldwin et al. |
| 7,425,709 | B2 | 9/2008 | Siegfried et al. |
| 7,622,721 | B2 | 11/2009 | Gutkin et al. |
| 2004/0016640 | A1 | 1/2004 | Veerasamy et al. |
| 2005/0247885 | A1 | 11/2005 | Madocks |
| 2006/0103319 | A1 | 5/2006 | Luten et al. |
| 2007/0241290 | A1* | 10/2007 | Zhurin ............... H01J 27/146 250/492.3 |
| 2008/0191629 | A1 | 8/2008 | Gutkin et al. |
| 2011/0226611 | A1 | 9/2011 | Madocks |

FOREIGN PATENT DOCUMENTS

| KR | 10-2006-0066791 A | 6/2006 |
| KR | 10-2011-0118622 A | 10/2011 |

* cited by examiner

*Primary Examiner* — Kiet T Nguyen
(74) *Attorney, Agent, or Firm* — Rabin & Berdo, P.C.

(57) ABSTRACT

An ion beam source includes a magnetic field unit including a first side facing a target object to be treated and a second side, where the first side is opened and the second side is closed, and the first side includes a plurality of magnetic pole portions arranged at predetermined intervals with an N-pole and an S-pole alternatively or with same magnetic poles and configured to form a closed loop of plasma electrons and an electrode unit arranged at a lower end of the closed loop. The ion beam source is configured to rotate the plasma electrons within a process chamber along the closed loop, to generate plasma ions from an internal gas within the process chamber, and to provide the plasma ions to the target object.

19 Claims, 11 Drawing Sheets

ION BEAM SOURCE

CROSS-REFERENCE TO RELATED APPLICATIONS

This application is a continuation of International Application No. PCT/KR2014/003683, filed Apr. 25, 2014, which is based upon and claims the benefit of priority from Korean Patent Application Nos. 10-2013-0046947, filed on Apr. 26, 2013, 10-2013-0067501, filed on Jun. 13, 2013, 10-2013-0131434, filed on Oct. 31, 2013, and 10-2014-0041227, filed on Apr. 7, 2014, the contents of which are incorporated herein by reference in their entirety.

BACKGROUND

1. Field

The present disclosure relates to an ion beam source.

2. Description of the Related Art

An ion beam source is a device that generates ions in a plasma shape by using ionized gas and emits the generated ions in a beam shape, which is an important component in a thinfilm process. The ion beam emitted from the ion beam source can be used to perform processes of surface modification, surface cleaning, pre-processing, assisted deposition of thinfilm, etching, post-processing, and the like. The ion beam source forms a closed loop (closed drift loop) using electrodes and magnetic poles and transfers electrons along the closed loop at high speed. The closed loop, in which the electrons are transferred, is continuously provided with ionization gas from outside for generating the ions.

U.S. Pat. No. 7,425,709 discloses an ion beam source including a gas supply tube for supplying ionization gas to the inside, i.e., backward of an electrode, an electrode that allows cooling water to flow therein, and an interval adjustment screw for maintaining an interval between the electrode and the magnetic pole constant, in order to solve problems of dissipating heat generated from the inside and keeping plasma uniformity constant.

However, such an ion beam source causes etching phenomenon in a direction of the internal electrode surface during the ionization processing under plasma and causes substrate contamination as etched impurities moves along with the generated ions to a substrate by pressure difference. Further, particles in emission area are attached on the electrode and generate an electric arc on the electrode. The generation of such impurities and the generation of the arc degrade the ionization capability of the ion beam source, affecting a continuous research for long time and a post-processing.

U.S. Pat. No. 6,750,600, U.S. Pat. No. 6,870,164, KR Pub. No. 10-2011-0118622 describe methods of changing the polarity of the electrode.

SUMMARY

An ion beam source, according to some embodiments of the present invention, includes a magnetic field unit including a first side facing a target object to be treated and a second side, where the first side is opened and the second side is closed, and the first side includes a plurality of magnetic pole portions arranged at predetermined intervals with an N-pole and an S-pole alternatively or with same magnetic poles and configured to form a closed loop of plasma electrons and an electrode unit arranged at a lower end of the closed loop. The ion beam source is configured to rotate the plasma electrons within a process chamber along the closed loop, to generate plasma ions from an internal gas within the process chamber, and to provide the plasma ions to the target object.

An ion beam source, according to some embodiments of the present invention, includes a magnetic field unit including a first side facing a target object to be treated and a second side, where the first side is opened and the second side is closed, and the first side includes a plurality of magnetic pole portions arranged at predetermined intervals with an N-pole and an S-pole alternatively or with same magnetic poles and configured to form a closed loop of plasma electrons and an electrode unit arranged at a lower end of the closed loop. The ion beam source is configured to rotate the plasma electrons within a process chamber along the closed loop, to generate plasma ions from an internal gas within the process chamber, and to provide the plasma ions to the target object. Intensities of magnetic fields generated at the magnetic pole portions are equivalent at points where the closed loop is formed.

An ion beam source, according to some embodiments of the present invention, includes a magnetic field unit including a first side facing a target object to be treated and a second side, where the first side is opened and the second side is closed, and the first side includes a plurality of magnetic pole portions arranged at predetermined intervals with an N-pole and an S-pole alternatively or with same magnetic poles and configured to form a closed loop of plasma electrons and an electrode unit arranged at a lower end of the closed loop. The ion beam source is configured to rotate the plasma electrons within a process chamber along the closed loop, to generate plasma ions from an internal gas within the process chamber, and to provide the plasma ions to the target object. The magnetic field unit is center-bent, and both sides of magnetic field unit are inclined forward or backward.

DETAILED DESCRIPTION OF THE PREFERRED EMBODIMENTS

Figure 1:
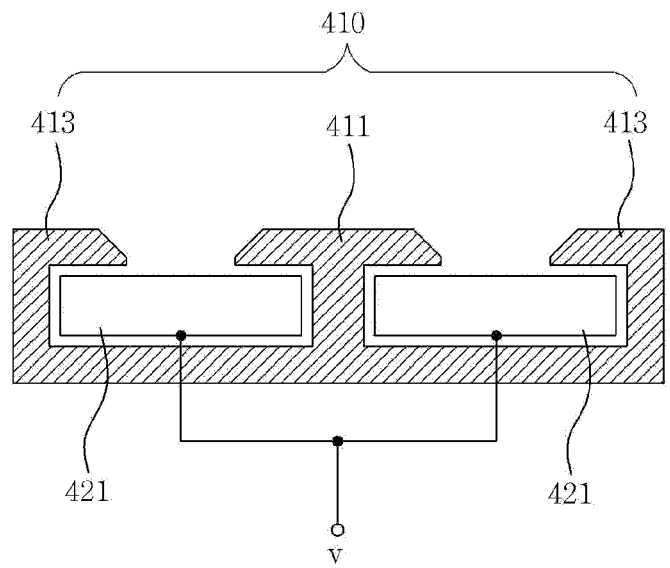
FIG. 1 is a cross-sectional view of an ion beam source employing an internal gas according to the present invention.

Exemplary embodiments of the present disclosure are described in detail below with reference to the accompanying drawings. In the following descriptions, like reference numerals designate like elements although the elements are shown in different drawings. Further, detailed descriptions of known functions and configurations incorporated herein are omitted for the purpose of clarity and for brevity.

The conventional method of changing the polarity of the electrode requires additional components to change the polarity of a power supply, causing a highly complex structure with high manufacturing cost. Further, it has a limit to remove the ions deposited on the electrodes or the magnetic poles by way of the polarity change. Particularly, since the gas for ion generation is supplied from the outside to the back of the electrode, it has a limit to prevent the contamination of the electrodes and the magnetic pole.

Further, since the conventional ion beam source moves the generated ions to a substrate in diffusion method, it has a limit to increase the deposition rate at high pressure process (wherein the ion mean free path is short) and thus, it has become a cause of low yield.

FIG. 1 is a cross-sectional view of an ion beam source 400 employing an internal gas according to some embodiments of the present invention.

As shown in FIG. 1, the ion beam source 400 includes a magnetic field unit 410 and an electrode unit 421.

The magnetic field unit 410 is functionally divided into a magnetic portion, magnetic pole portions 411 and 413, a magnetic core portion, etc., and structurally formed integrally with the electrode unit 421 embedded therein. The magnetic field unit 410 forms a closed loop space therein. The closed loop space formed by the magnetic field unit 410 is opened toward the direction of the magnetic pole portion and closed toward the direction of the magnetic core portion.

The magnetic portion may be located between the magnetic pole portion and the magnetic core portion. The magnetic portion may be comprised of permanent magnet or electromagnet, for example, configured to have N-pole at upper end and S-pole at lower end. In addition, in the case of forming a single closed loop as shown in FIG. 1, the magnetic portion may be arranged at only the lower part of center magnetic pole portion 411 or at all lower ends of the center magnetic pole portion 411 and the magnetic pole portions 413.

A plurality of magnetic pole portions may be arranged as spaced at a predetermined interval in substrate direction. The magnetic pole portions 411 and 413 may be such that N-pole and S-pole are arranged alternatively across closed loops. For example, in the case of forming a single closed loop as shown in FIG. 1, it may be configured to set the center magnetic pole portion 411 to N-pole and the magnetic pole portions 413 on either side to S-pole. In this case, the center magnetic pole portion 411 is coupled to N-pole at the upper end of the magnetic portion, and the magnetic pole portions 413 on either side are coupled to S-pole at the lower ends of the magnetic portion via a magnetic core portion.

In a case where the magnetic portion is arranged, for example, only at the lower part of the center magnetic pole portion 411, the magnetic core portion magnetically couples the lower end of the magnetic portion to the magnetic pole portions 413 on either side, and provides a passage through which lines of magnetic force of S-pole at the low end of magnetic portion pass. The magnetic core portion is coupled to the magnetic pole portions 413 on either side to cause the magnetic pole portions 413 on either side to be S-pole. In addition, the magnetic core portion minimizes the impact of the lines of magnetic force of S-pole against the lines of magnetic force of N-pole, that is, the impact of the magnet itself wherein the S-pole and the N-pole are at the lower end and the upper end of the magnetic portion, respectively.

The electrode unit 421 is provided in a space in the magnetic field unit 410, that is, at lower part of closed loop space. The electrode unit 421 is integrally provided by being coupled along the closed loop space. The electrode unit 421 is applied with AC or DC voltage.

In the ion beam source having such a configuration, internal electrons or plasma electrons move at high speed along the closed loop space by magnetic field generated between the magnetic pole portions 411 and 413 and electric field generated between the electrode unit 421 and external opposite electrode portion. The internal electrons or plasma electrons which move at high speed ionize the internal gas present in the inside of a closed loop, and cations of the ionized plasma ions move toward substrate carrier by electric field, etc. between the electrode unit 421 and external electrode unit such as the substrate carrier, and then the moving cations cause surface modification, assisted deposition, etching, etc. on the substrate depending on energy value of moving ions Hereinafter, the present invention will be described in detail with reference to the accompanying drawings.

Figure 2:
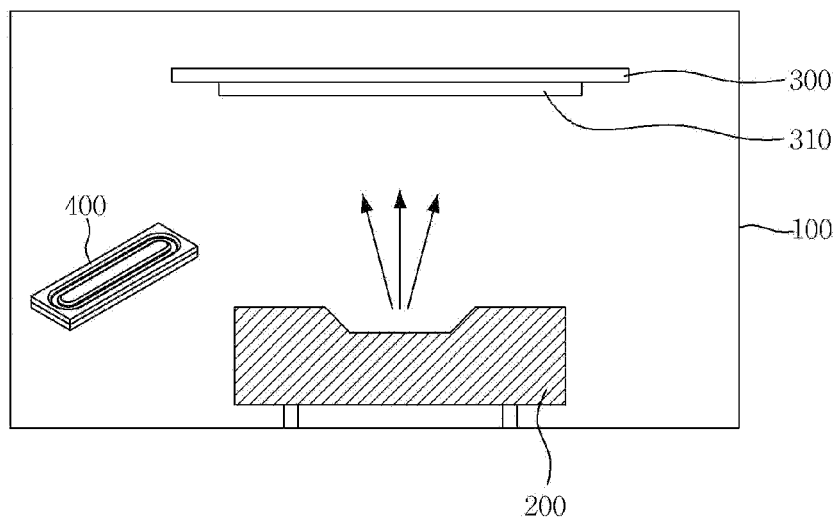
FIG. 2 is a schematic diagram of an ion beam processing apparatus including an ion beam source using process chamber internal gas.

FIG. 2 illustrates the ion beam processing apparatus comprising an ion beam source using process chamber internal gas.

As shown in FIG. 2, the ion beam processing apparatus comprises a process chamber 100, a deposition module 200, a substrate carrier 300, the ion beam source 400, etc.

The process chamber 100 forms a sealed internal space for thinfilm deposition. The process chamber 100 includes one side which is coupled to a vacuum pump. The vacuum pump maintains internal space at predetermined process pressure. The process chamber 100 is injected with non-reaction gas or reaction gas depending on processing. The non-reaction gas is, for example, Ar, Ne, He, Xe, etc., whereas the reaction gas is, for example, $N_2$, $O_2$, $CH_4$, $CF_4$ etc. In some cases, it may be used to mix the non-reactive gas and the reaction gas.

The deposition module 200 is provided within the process chamber 100 and includes target or evaporation materials. The deposition module 200 ejects the target or evaporation materials and supplies them to a substrate 310 in the form of a mass of ions, atoms or neutral particles. Particles moving to the substrate 310 are deposited on the substrate 310 in the form of a thinfilm.

The substrate carrier 300 supports the substrate 310 to be arranged opposite to the deposition module 200, and moves the substrate 310 to a predetermined direction.

When the deposition module 200 is used for sputtering process, the deposition module 200 is applied with a high negative voltage and the substrate carrier 300 is grounded. In this case, when argon gas is injected in the inside of the process chamber 100, the argon gas is ionized by high voltage between the deposition module 200 and the substrate carrier 300, thus becomes a plasma state. Ionized argon ions $Ar^+$ are accelerated by the high voltage, and hit to the target of the deposition module 200. Then, the target materials are ejected from the target in the form of ions and moves toward the substrate carrier 300, and thus the target materials are attached on the substrate 310 of the front side of the substrate carrier 300. With this process, the target materials are deposited on the substrate 310 in the form of a thinfilm.

The ion beam source 400 forms a circular or elliptical closed loop in which electrons move at high speed and collide with internal gas. As a result, plasma ions are generated from the internal gas.

The ion beam source 400 is supplied with power source from the outside, but separate ionized gas is not supplied to the inside of the ion beam source 400. Since the ionized gas is not supplied from the outside, the ion beam source 400 can use, as an initial ionization electrons, internal electrons present in the process chamber 100 or plasma electrons generated by high voltage between the deposition module 200 and the substrate carrier 300. In other words, the ion beam source 400 rotates the initial ionization electrons such as the internal electrons or the plasma electrons, etc. along a closed loop, generates plasma ions from the internal gas in the process chamber 100, and supplies it to the substrate 310.

The ion beam source 400 may be used as assistance purposes simultaneously with the process of depositing a thinfilm on the substrate 310 by the deposition module 200, or may be used for modifying the surface of the substrate before the deposition module 200 deposits a thinfilm on the substrate 310. The ion beam source 400 may also be used for post-processing of the substrate 310.

Figure 3A:
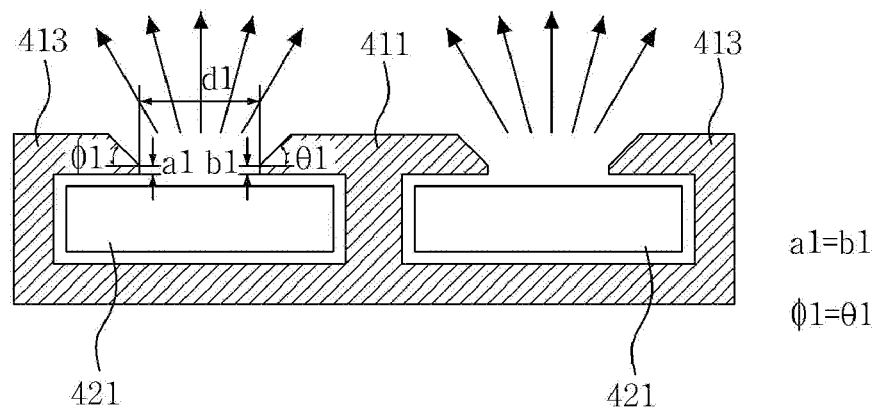
FIGS. 3A to 3C are cross-sectional views of ion beam sources respectively illustrating shapes of magnetic field units for changing the movement paths of plasma ions in the ion beam sources.
Figure 3B:
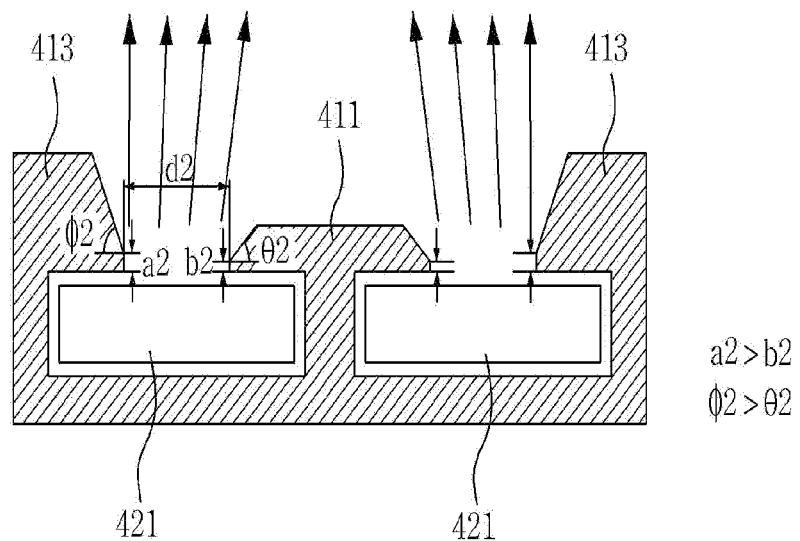
Figure 3C:
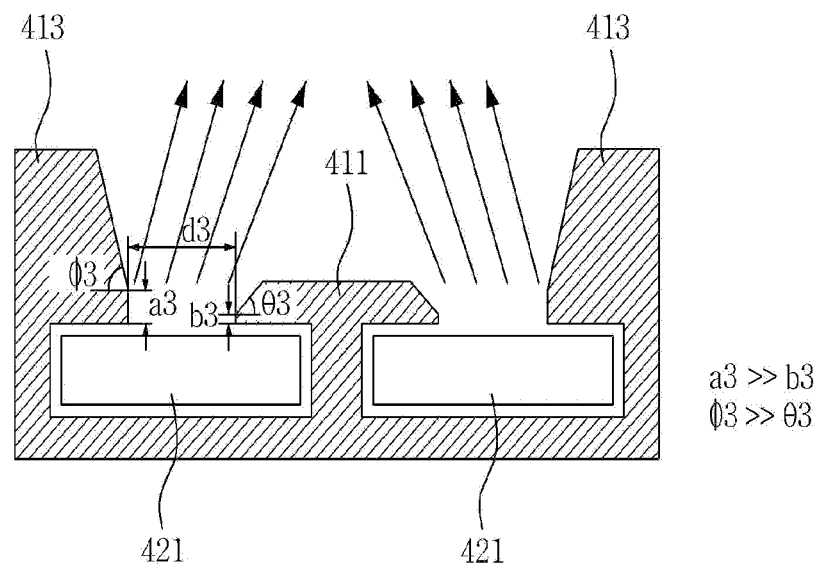

FIGS. 3A to 3C show the shapes of a magnetic field unit for changing the movement path of plasma ions in an ion beam source.

As shown in FIG. 3A, it is possible to diffuse plasma ions moving toward a substrate direction by extending the distance d1 between center magnetic pole portion 411 and magnetic pole portions 413 on either side, lowering the height a1 and b1 of vertical extension portion, and reducing the inclination angles θ1 and Φ1 of slopes.

As shown in FIG. 3B, it is possible to move plasma ions parallel to the substrate direction by reducing the distance d2 between the center magnetic pole portion 411 and the magnetic pole portions 413 on either side narrower than in the example of FIG. 3A, raising the height a2 of vertical extension portion of the magnetic pole portions 413 on either side higher than the height b2 of vertical extension portion of the center magnetic pole portion 411, and reducing the inclination angle θ2 of the slope of the center magnetic pole portion 411 smaller than the inclination angles Φ2 of the slopes of the magnetic pole portions 413 on either side.

As shown in FIG. 3C, it is possible to concentrate plasma ions on a predetermined area of the substrate by reducing the distance d3 between the center magnetic pole portion 411 and the magnetic pole portions 413 on either side narrower than in the example of FIG. 3B, raising the height a3 of vertical extension portion of the magnetic pole portions 413 on either side much higher than the height b3 of vertical extension portion of the center magnetic pole portion 411, and reducing the inclination angle θ3 of the slope of the center magnetic pole portion 411 much smaller than the inclination angles Φ3 of the slopes of the magnetic pole portions 413 on either side.

Figure 4:
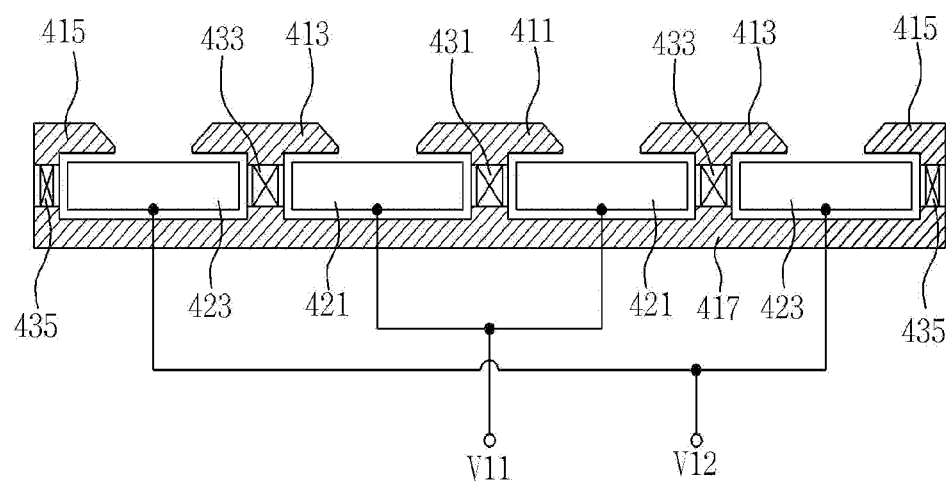
FIG. 4 is a cross-sectional view of an ion beam source including multiple loops.

FIG. 4 is a cross-sectional view showing an ion beam source having multiple loops.

As shown in FIG. 4, a multiple loops ion beam source has a plurality of closed loops.

A magnetic field unit may comprise magnetic portions 431, 433 and 435, magnetic pole portions 411, 413 and 415, and a magnetic core portion 417, and forms two circular or elliptical closed loops. A closed loop formed by a magnetic field unit is opened in the direction of the magnetic pole portion 411, 413 and 415, and closed in the direction of the magnetic core portion 417.

Magnetic portions 431, 433 and 435 are arranged at lower ends of magnetic pole portions 411, 413 and 415, respectively, and comprised of permanent magnet or electromagnet. In the case of applying the permanent magnet of same material, the cross-sectional area of at least edge magnetic portion 435 can be reduced to a half the cross-sectional area of other magnetic portions 431 and 433, by which it is possible to keep the intensity of magnetic field generated from the magnetic pole portion 411, 413 and 415, uniformly.

The magnetic pole portions 411, 413 and 415 are arranged as spaced at a predetermined interval in substrate direction. The magnetic pole portions 411, 413 and 415 are such that N-pole and S-pole are arranged alternatively across closed loops. For example, when it is configured to set the center magnetic pole portion 411 to N-pole, adjacent magnetic pole portions 413 are set to S-pole, and edge magnetic pole portions 415 are set to N-pole.

The magnetic core portion 417 couples the lower ends of the magnetic portions 431, 433 and 435 to form a connection passage of magnetic field.

The electrode units 421 and 423 are provided at the lower parts of closed loop spaces between the magnetic pole portions 411 and 413 and between the magnetic pole portions 413 and 415, and insulated from the magnetic field unit (411, 413, 415, 431, 433, 435, and 417).

The electrode units 421 and 423 are applied with power source V11 and V12, respectively. When the power source V11 is applied to the electrode unit 421 and the power source V12 is applied to the electrode unit 423, as shown in FIG. 4, two closed loops having same center are formed as an internal loop and an external loop.

Figure 5A:
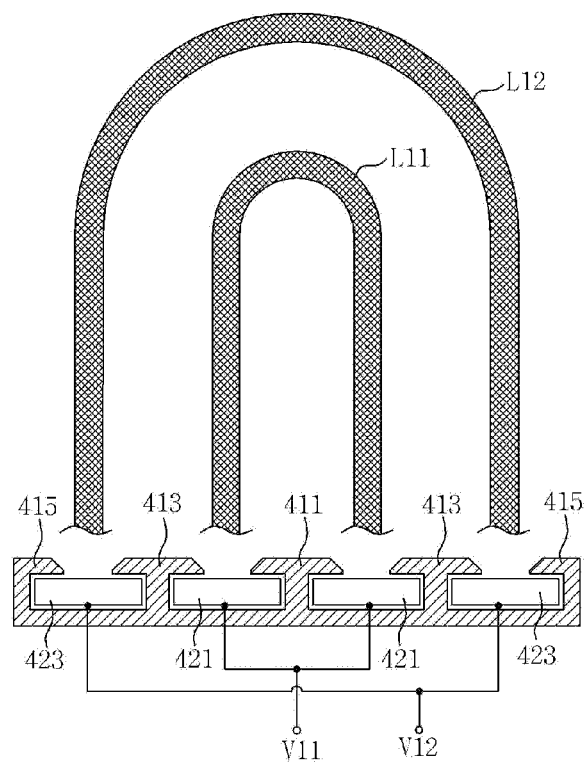
FIGS. 5A and 5B illustrate applied voltages and loops generated by the multiple loops ion beam source.
Figure 5B:
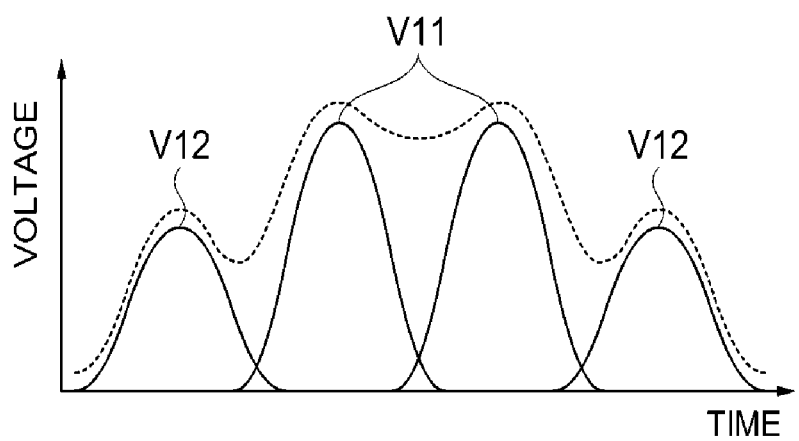

FIGS. 5A and 5B illustrate applied voltages and closed loops generated by the multiple loops ion beam source.

As shown in FIG. 5A, first closed loop L11 is formed by magnetic pole portions 411 and 413 and an electrode unit 421, and a part of internal electrons or plasma electrons move along the first closed loop L11 at high speed, thereby ionizing internal gas. Second loop L12 is formed by magnetic pole portions 413 and 415 and an electrode unit 423, and another part of internal electrons or plasma electrons move along the second closed loop L12 at high speed, thereby ionizing internal gas.

As shown in FIG. 5B, the electrode units 421 and 423 forming the first closed loop L11 and the second closed loop L12 may be applied with different levels of voltages V11 and V12. When the applied voltages are different, the movement speeds of electrons moving along closed loops are different. As a result, the degrees of ionizations of internal gases are different, thus the numbers of generated plasma ions are different.

In General, when modifying the surface of a substrate, the substrate may be damaged when a large amount of plasma ions are applied from the beginning. Therefore, it may be needed to gradually increase the amount of plasma ions which are applied to the substrate. Further, it is possible to enhance the effects of surface modification when gradually reducing the amount of plasma ions when exiting the process. Thus, it may be performed to initially execute the pre-processing for supplying a small amount of plasma ions, and then execute the main processing for supplying a large amount of plasma ions, and lastly execute post-processing for reducing the amount of supplied plasma ions. In order to proceed with the processing, the electrode unit 421 forming the first closed loop L11 may be applied with a relatively high voltage V11, whereas the electrode unit 423 forming the second closed loop L12 may be applied with a relatively low voltage V12, as shown in FIG. 5B.

Figure 6A:
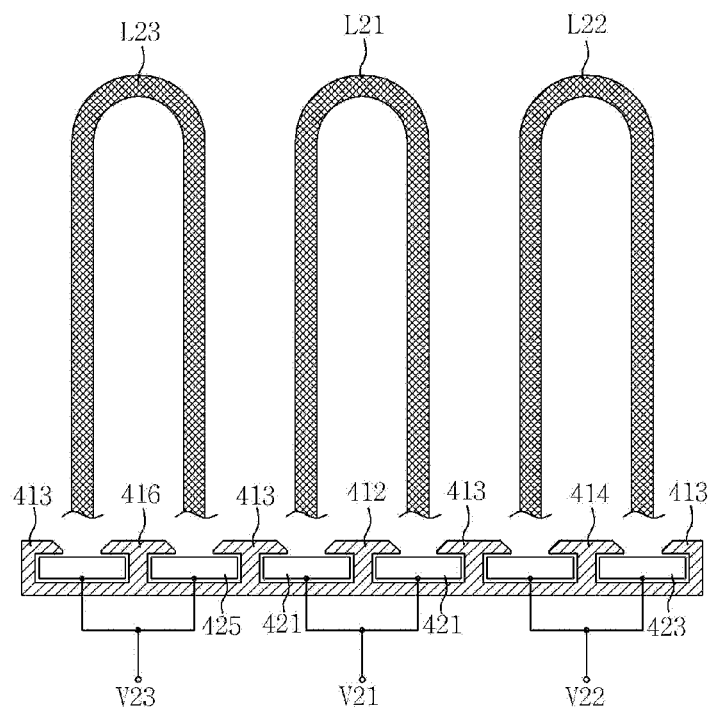
FIGS. 6A and 6B are schematic diagrams illustrating a modified example of applied voltages and loops generated by a multiple-loop ion beam source.
Figure 6B:
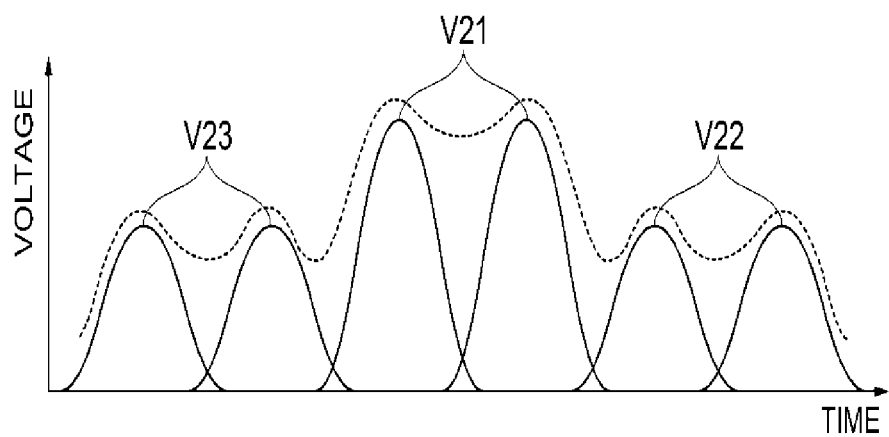

FIGS. 6A and 6B show a modified example of the applied voltages and the closed loops of the multiple loops ion beam source.

As shown in FIG. 6A, it is possible to configure multiple loops in a form which couples three single loops in parallel. First closed loop L21 which is located on the center is formed by magnetic pole portions 412 and 413 and an electrode unit 421, second closed loop L22 which is located on the right side is formed by magnetic pole portions 414 and 413 and an electrode unit 423, and third closed loop L23 which is located on the left side is formed by magnetic pole portions 416 and 413 and an electrode unit 425. The closed loops L21. L22 and L23 are arranged side by side, each of which forms an independent closed loop and rotates a part of internal electrons or plasma electrons at high speed.

As shown in FIG. 6B, when the electrode unit 421 forming center closed loop L21 is applied with a relatively high voltage V21, and the electrode units 423 and 425 forming closed loops L22 and L23 on either side are applied with relatively low voltages V22 and V23, a substrate may be executed by pre-proceeding, main proceeding and post-proceeding, as described in FIGS. 5A and 5B.

Figure 7A:
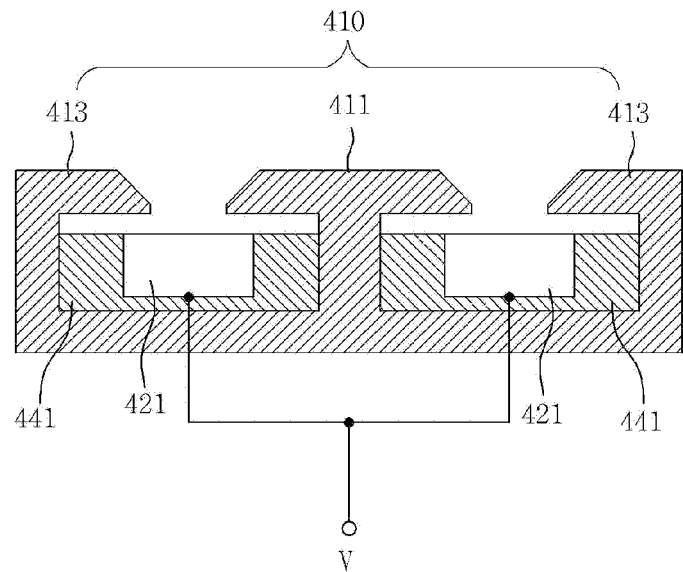
FIG. 7A is a cross-sectional view of an ion beam source including a insulating fixing portion.

FIG. 7A is a cross-sectional view of an ion beam source having an insulating fixing portion.

As shown in FIG. 7A, an ion beam source may comprise a magnetic field unit 410, an electrode unit 421 and an insulating fixing portion 441.

The insulating fixing portion 441 is filled in internal surface of magnetic pole portions 411 and 413 and in external surface of the electrode unit 421, and fixes the electrode unit 421 into the inside of the magnetic field unit 410 while maintaining a predetermined interval. Then, the insulating fixing portion 441 is filled in a region except the space that forms a closed loop between the magnetic pole portions 411 and 413 and the electrode unit 421.

The insulating fixing portion 441 may comprise mica, Steatite, quartz glass, soda glass, lead glass, polyester, polyethylene, polystyrene, polypropylene, polyvinyl chloride, natural rubber, ebonite, butyl rubber, chloroprene rubber, silicone rubber, epoxy resin, varnish formal resin varnish, fluorine resin, Teflon resin, engineering plastics such as PEEK, etc.

Figure 7B:
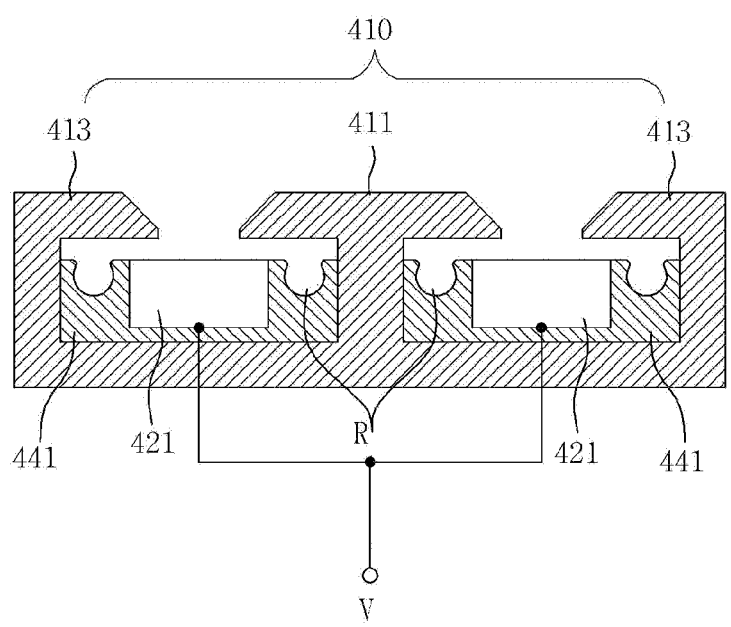
FIG. 7B is a cross-sectional view of an ion beam source including a modified insulating fixing portion.

FIG. 7B is a cross-sectional view of an ion beam source having a modified insulating fixing portion.

As shown in FIG. 7B, the insulating fixing portion 441 may form a concavo-convex portion such as a recess R in an opening surface. The concavo-convex portion R may comprise depression type or protruded type having a shape of circle, triangle, quadrangle, etc.

The concavo-convex portion R reduces the risk of a short-circuit between the magnetic field unit 410 and the electrode unit 421. Attachments in an ion beam source or a process chamber are etched by plasma ions, plasma electrons, etc. When etching contaminants generated in such a circumstance are deposited on the opening surface of the insulating fixing portion 441, a short-circuit is caused between the magnetic field unit 410 and the electrode unit 421. However, when the concavo-convex portion R is formed on the opening surface of the insulating fixing portion 441, it is hard for plasma ions or etching contaminants to be deposited in the concavo-convex portion R due to the characteristics of the deposition, thus it is possible to effectively avoid the short-circuit between the magnetic field unit 410 and the electrode unit 421. Further, when increasing the width and depth of the concavo-convex portion R, it is possible to more effectively reduce the risk of the short-circuit between the magnetic field unit 410 and the electrode unit 421.

Figure 8A:
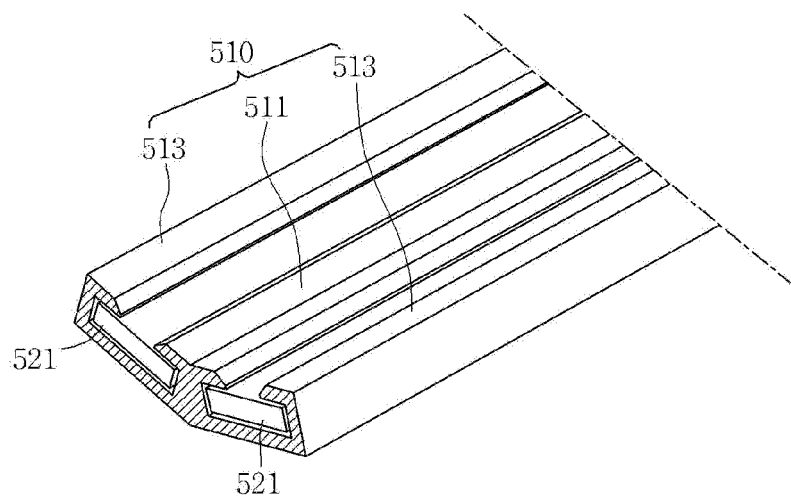
FIG. 8A is a perspective view of an inclined ion beam source of a single loop.
Figure 8B:
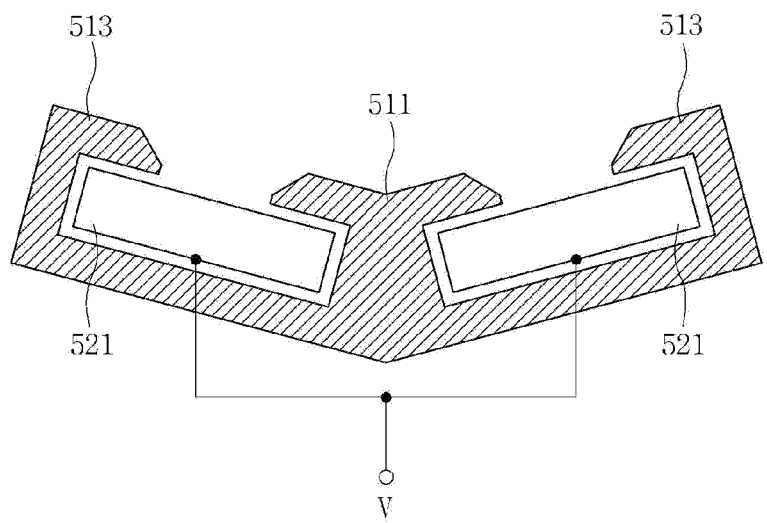
FIG. 8B is a cross-sectional view of an inclined ion beam source of a single loop.

FIGS. 8A and 8B are a perspective view and a cross-sectional view, respectively, showing the inclined ion beam source of a single loop.

An inclined ion beam source of a single loop comprises a magnetic field unit 510, an electrode unit 521, etc.

As shown in FIGS. 8A and 8B, the magnetic field unit 510 is center-bent and inclined. In addition, the inclination of the magnetic field unit 510 may be configured to be symmetrical to each other.

The electrode unit 521 is provided in the space between the magnetic pole portions 511 and 513, that is, in closed loop space, and insulated from the magnetic field unit 510. The electrode unit 521 is supplied with power source V from the outside.

The inclined ion beam source of single loop having such a configuration can supply the plasma ions generated from internal gas in a process chamber to a substrate in a concentrated form. Of course, when the inclination of the ion beam source is changed into opposite direction, the generated plasma ions may be supplied to the substrate in a diverging form.

Figure 9A:
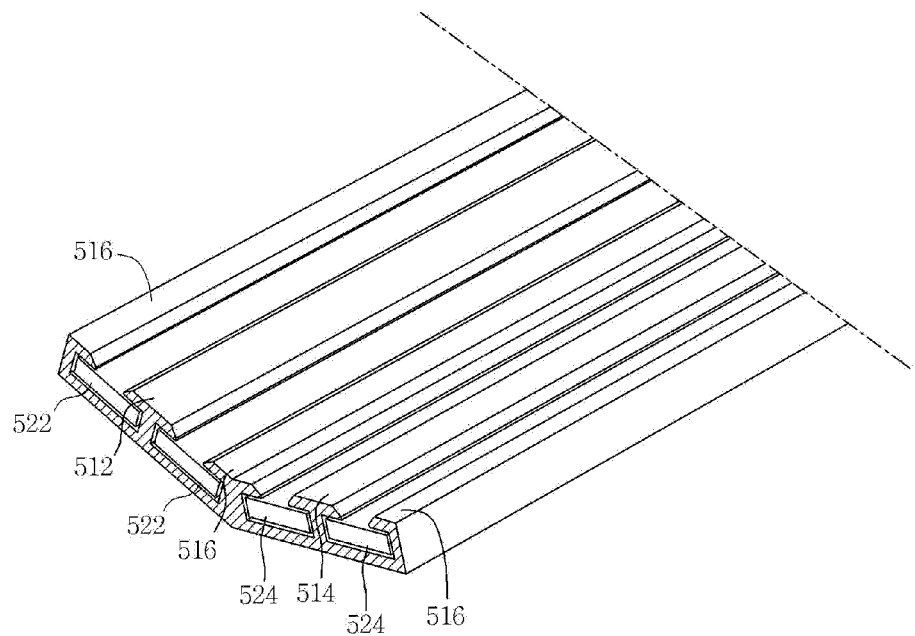
FIG. 9A is a perspective view of an inclined ion beam sources of multiple loops.
Figure 9B:
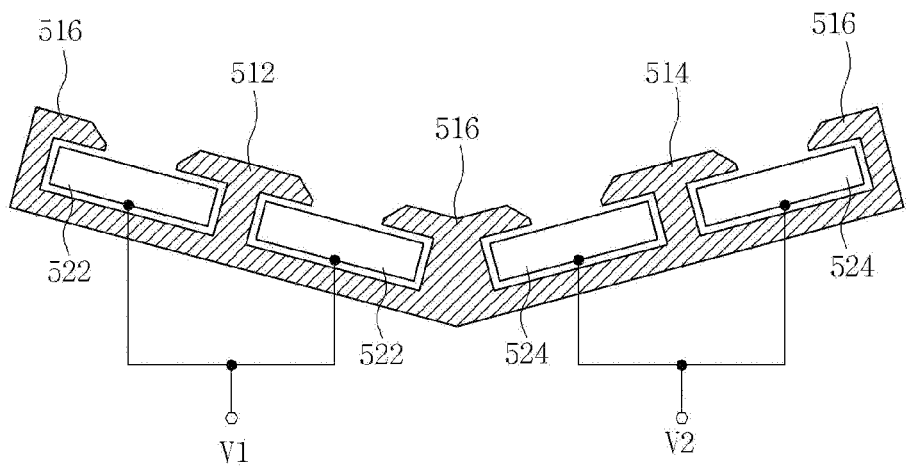
FIG. 9B is a cross-sectional view of an inclined ion beam source of multiple loops.

FIGS. 9A and 9B are a perspective view and a cross-sectional view, respectively, showing the inclined ion beam sources of multiple loops.

As shown in FIGS. 9A and 9B, in an inclined ion beam source of multiple loops, magnetic pole portions 512, 514 and 516 comprise magnetic pole portions 512 and 516 forming first closed loop and magnetic pole portions 514 and 516 forming second closed loop. The front of the magnetic pole portions 512 and 514 are configured to have a peak of a rod shape on either side, each of which is surrounded by the magnetic pole portion 516. The back of the magnetic pole portions 512, 514 and 516 is magnetically coupled by a magnetic core portion.

As shown in FIGS. 9A and 9B, the center magnetic pole portion 516 is center-bent and inclined, wherein the first closed loop and the second closed loop may be configured to be symmetrical to each other.

An electrode unit 522 is provided in the space between the magnetic pole portions 512 and 516, that is, in the space of the first closed loop, and insulated from the magnetic pole portions 512 and 516. An electrode unit 524 is provided in the space between the magnetic pole portions 514 and 516, that is, the space of the second closed loop, and insulated from the magnetic pole portions 514 and 516. The electrode units 522 and 524 are supplied with power sources V1 and V2, respectively, from the outside.

Figure 10A:
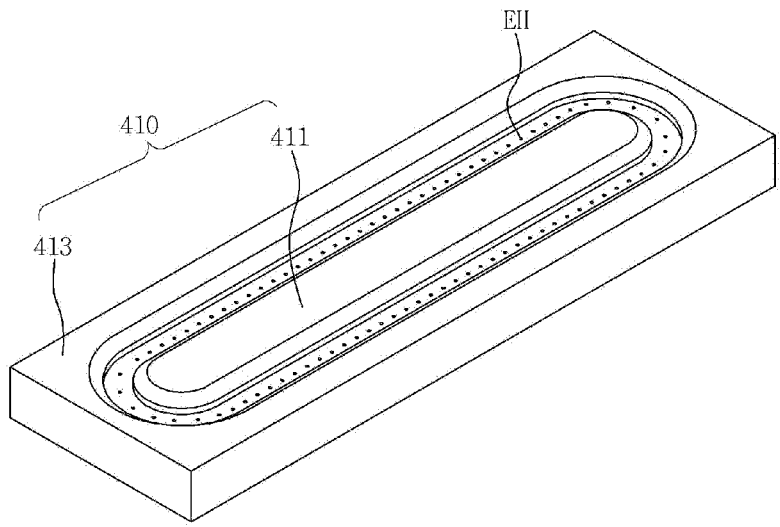
FIG. 10A is a perspective view of an ion beam source including a reaction gas ejection portion in an electrode unit.
Figure 10B:
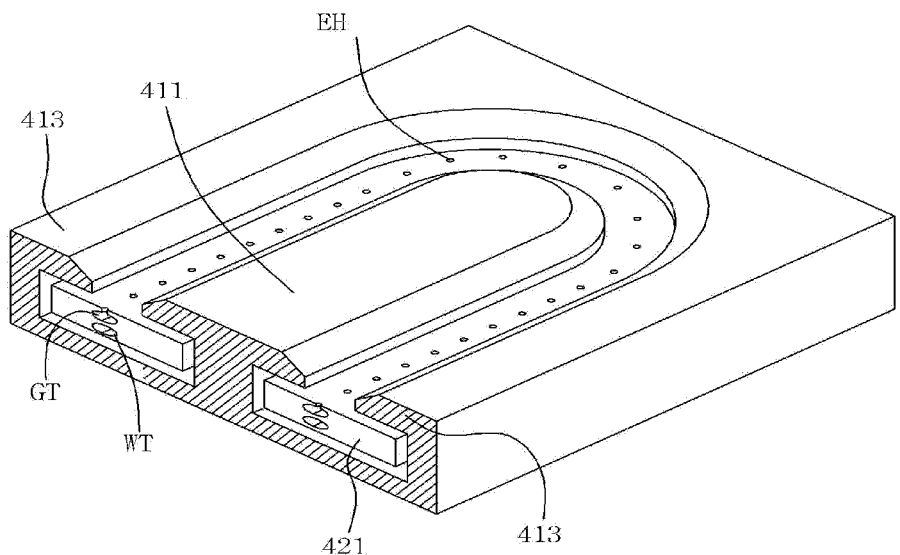
FIG. 10B is a partial perspective view of an ion beam source including a reaction gas ejection portion in an electrode unit.
Figure 10C:
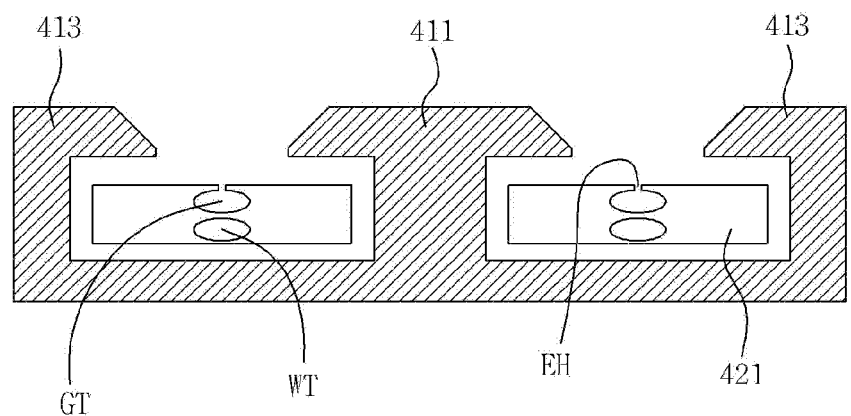
FIG. 10C is a cross-sectional view of an ion beam source including a reaction gas ejection portion in an electrode unit.

FIGS. 10A to 10C are a perspective view, a partial cut-away perspective view and a cross-sectional view, respectively, showing an ion beam source comprising a reaction gas ejection portion in an electrode unit.

As shown in FIGS. 10A to 10C, an ion beam source comprises a magnetic field unit 410, an electrode unit 421, etc.

The electrode unit 421 comprises a cooling water tube WT and a reaction gas tube GT therein.

The cooling water tube is communicated along longitudinal direction within the inside of the electrode unit 421. The electrode unit 421 is connected to AC or DC high voltage. When the electrode unit 421 is applied with high voltage, heat is generated in the electrode unit 421. To cool the heat of the electrode unit 421, the coolant flows through the cooling water tube WT. The cooling water tube WT may use a through portion of tube shape made in the electrode unit 421 or use a separately inserted metal tube with excellent electrical conductivity and thermal conductivity.

The reaction gas tube GT is separated from the cooling water tubes WT, and communicated along longitudinal direction within the inside of the electrode unit 421. Reaction gas supplied from the outside, this is, reactive radical gas for generating ions which are deposited on a substrate, flows in the inside of the reaction gas tube GT. The reactive radical gas is reaction gas such as $O_2$, $N_2$ or thinfilm forming gas such as $CH_3COOH$, $CH_4$, $CF_4$, $SiH_4$, $NH_3$, TMA (tri-methyl aluminum), etc. In some cases, it may be used by mixing these gases.

The reaction gas tube GT is formed with a gas ejection part EH which communicates with the opening side of the magnetic pole portions 411 and 413. The gas ejection portion EH comprises a plurality of holes spaced at a predetermined interval. In this case, the reactive radical gas is ejected through a plurality of holes. As a result, the reactive radical gas moves toward the substrate while forming a plurality of separated gas flows.

The ion beam source having this configuration of electrode unit generates deposition ions by ionizing the reactive radical gas ejected from the gas ejection portion EH, using internal electrons and plasma electrons rotated at high speed in a closed loop. The generated deposition ions are moved toward the substrate at high speed by complex actions of the electric field between the substrate and the electrode unit 421, the gas flows according to ejection of the gas ejection portion EH, etc. As a result, it is possible to increase the deposition rate.

Figure 11:
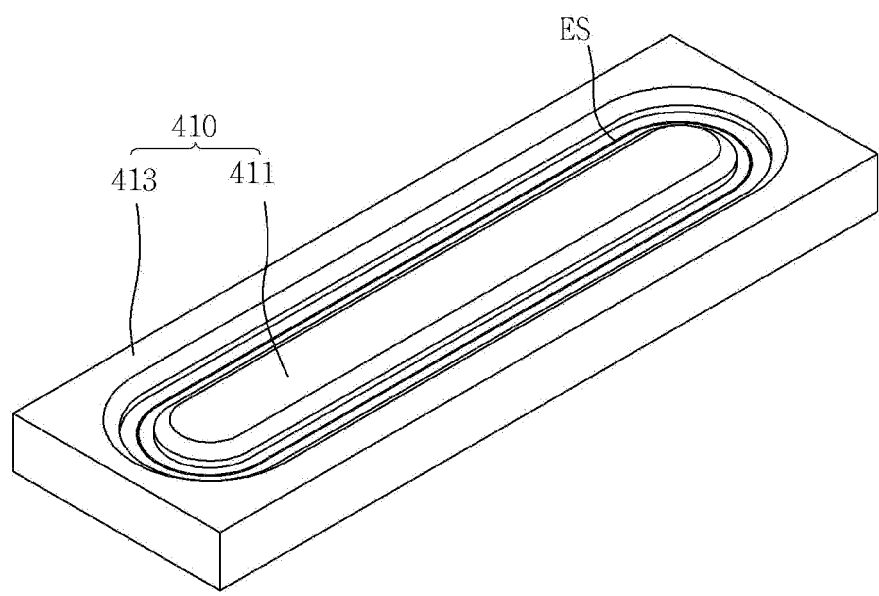
FIG. 11 is a perspective view of a modified example of an ion beam source including a reaction gas ejection portion in an electrode unit.

FIG. 11 is a perspective view showing a modified example of an ion beam source comprising a reaction gas ejection portion in an electrode unit.

The modified example shown in FIG. 11 comprises a gas ejection portion with a shape of cut out slit ES. Thus, when the gas ejection portion is made up of the shape of slit, it can be helpful in forming uniform deposition film by uniformly distributing the density of deposition ions moved toward a substrate.

Figure 12A:
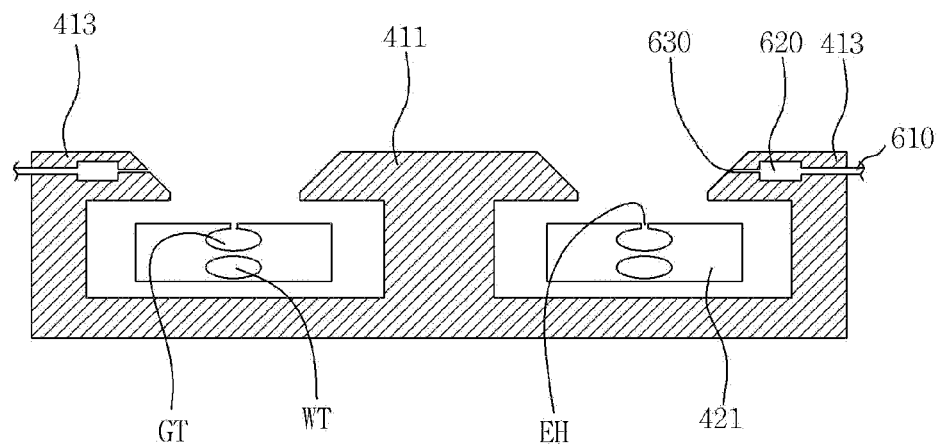
FIG. 12A is a cross-sectional view of an ion beam source including adjusting gas inlet portion for injecting process pressure adjusting gas.
Figure 12B:
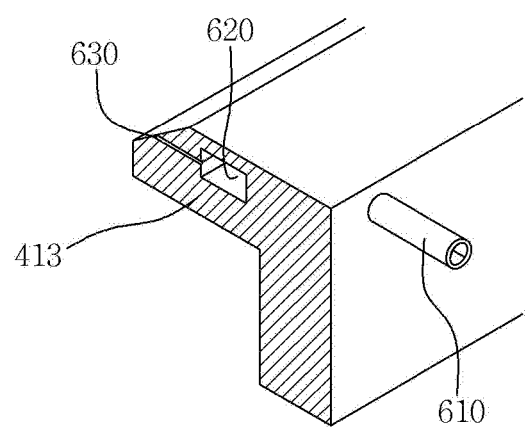
FIG. 12B is a partial perspective view of an ion beam source including adjusting gas inlet portion for injecting process pressure adjusting gas.

FIGS. 12A and 12B are a perspective view and a partial perspective view, respectively, showing an ion beam source having adjusting gas inlet portion for injecting process pressure adjusting gas.

When the pressure of a process chamber is very low or high, for example, such as in range of $10^{-5}$~$10^{-6}$ Torr, it can be difficult to maintain a desired plasma ion density. In this case, it may be needed to selectively or locally inject pressure adjusting gas for ionization.

To this end, an ion beam source according to the present invention comprises separately an adjusting gas inlet portion for injecting ionization pressure adjusting gas. The adjusting gas inlet portion comprises an adjusting gas tube 610, an adjusting gas channel 620, an adjusting gas diffusing slit 630, etc.

As shown in FIGS. 12A and 12B, magnetic pole portion 413 comprises the adjusting gas tube 610 therein, which is communicated with the outside. The adjusting gas tube 610 is a passage through which the adjusting gas is introduced for adjusting ionization pressure. The ionization pressure adjustment gas is, for example, plasma ionized gas such as Ar, reaction gas such as $O_2$, $N_2$, thinfilm forming gas such as $CH_3COOH$, $CH_4$, $CF_4$, $SiH_4$, $NH_3$, TMA (tri-methyl aluminum), etc., or radical gas, etc. In some cases, it may be used by mixing these gases.

The magnetic pole portion 413 is formed with the adjusting gas channel 620 having a shape of communicating ball formed therein, which is coupled to the adjusting gas tube 610 and formed along longitudinal direction of the magnetic pole portion 413. The adjusting gas channel 620 distributes the process pressure adjusting gas introduced from the adjusting gas tube 610 to the longitudinal direction of the magnetic pole portion 413.

In addition, the magnetic pole portion 413 comprises the adjusting gas diffusing slit 630 communicated with a closed loop space. The adjusting gas diffusing slit 630 is communicated with the adjusting gas channel 620, and made up of a shape of slit cut out/opened toward closed loop direction along longitudinal direction of the magnetic pole portion 413.

According to an adjusting gas inlet portion having such a configuration, when the process pressure adjusting gas is introduced through the adjusting gas tube 610, the adjusting gas channel 620 distributes uniformly the process pressure adjusting gas to longitudinal direction of the magnetic pole portion 413, and then the adjusting gas diffusing slit 630 ejects and diffuses the process pressure adjusting gas to the direction of the closed loop.

The above adjusting gas inlet portion is to inject the process pressure adjusting gas to the closed loop space in which Lorentz force acts, not to inject the process pressure adjusting gas to the inside of the ion beam source, that is, the space between the magnetic field unit and the electrode unit 421.

As described above, the present invention has been described based on various embodiments, it is to only illustrate the present invention. It will be apparent to those skilled in the art that various modifications or improvements can be added to the embodiments described above. It is apparent from the description of appended claims that embodiments with such modifications or improvements are also included in the scope of the invention.

The present disclosure is intended to solve the problems of the conventional ion beam source, and to provide an ion beam source which is capable of:

minimizing the deposition of contaminants on substrate, electrode, magnetic pole, etc.;

adjusting movement direction of generated ions;

maintaining the spacing between magnetic pole and electrode constantly;

preventing condensation of gas by maintaining the temperature of the process ionized gas supplied to the inside of the ion beam source above the condensation temperature;

increasing the deposition rate even at high pressure process by ejecting the process ionized gas introduced to the inside of the ion beam source and forming the stream of gas; and performing in-situ cleaning.

According to the ion beam source of the present invention having such a configuration, the ion beam source generates deposition ions, etc. using the internal gas of process chamber. Therefore, it is possible to not only minimize the deposition of contaminants on substrate, electrode portion, magnetic pole portion, etc., but also affect less the process pressure in the chamber even when a number of ion beam sources are installed in succession and a number of ion beam loops are formed.

According to the ion beam source of the present invention, it is possible to adjust the movement direction of generated ions via the deformation of the shape of the magnetic pole portion, and thus it can be applied to match the process characteristics.

According to the ion beam source of the present invention, it is possible to maintain the spacing between magnetic field unit and electrode unit constantly by fixing the electrode unit to the magnetic field unit using an insulating fixing portion.

According to the ion beam source of the present invention, it is possible to maintain the temperature of the process ionized gas above the condensation temperature by supplying the process gas through the inside of the electrode unit even when the process ionized gas are injected to the inside of the source.

According to the ion beam source of the present invention, it is possible to increase the deposition rate even at high pressure process by ejecting the process ionized gas via slits of holes to increase the ejection effect of the process ionized gas introduced to the inside of the ion beam source.

According to the ion beam source of the present invention, it is possible to perform in-situ cleaning by injecting cleaning reaction gas, such as fluorine-based F— or chlorine-based Cl—, or its ions to the ejection portion of the process ionized gas.

The present disclosure should not be limited to these embodiments but various changes and modifications are made by one ordinarily skilled in the art within the subject matter, the spirit and scope of the present disclosure as hereinafter claimed. Specific terms used in this disclosure and drawings are used for illustrative purposes and not to be considered as limitations of the present disclosure. Exemplary embodiments of the present disclosure have been described for the sake of brevity and clarity. Accordingly, one of ordinary skill would understand the scope of the claimed invention is not to be limited by the explicitly described above embodiments but by the claims and equivalents thereof.

What is claimed is:

1. An ion beam source, comprising:
a magnetic field unit including a first side facing a target object to be treated and a second side, the first side opened and the second side closed, the first side including a plurality of magnetic pole portions arranged at predetermined intervals with an N-pole and an S-pole alternatively or with same magnetic poles and configured to form a closed loop of plasma electrons; and
an electrode unit arranged at a lower end of the closed loop, wherein
the ion beam source is configured
to rotate the plasma electrons within a process chamber along the closed loop,
to generate plasma ions from an internal gas within the process chamber, and
to provide the plasma ions to the target object.

2. The ion beam source according to claim 1, wherein intensities of magnetic fields generated at the magnetic pole portions are equivalent at points where the closed loop is formed.

3. The ion beam source according to claim 2, wherein the magnetic field unit includes magnetic portions at lower ends of the respective magnetic pole portions, and
the magnetic portion at the lower end of the magnetic pole portion on an edge has a cross-sectional area equal to half of that of the magnetic portion located at the lower end of each of other magnetic pole portions.

4. The ion beam source according to claim 1, wherein the magnetic field unit is configured to control concentration, divergence, or parallel movement of the plasma ions by adjusting at least one of thickness, inclination, or opening width of the magnetic pole portion adjacent to the first side.

5. The ion beam source according to claim 1, further comprising an insulating fixing portion filled between an inner surface of the magnetic field unit and an outer surface of the electrode unit excluding a space of the closed loop, the insulating fixing portion being configured to fix the electrode unit to the magnetic field unit.

6. The ion beam source according to claim 5, wherein the insulating fixing portion includes a concavo-convex portion on an opening surface that faces the first side.

7. The ion beam source according to claim 1, wherein the magnetic pole portion includes a gas inlet portion configured to inject an ionization adjusting gas into the process chamber.

8. The ion beam source according to claim 7, wherein the gas inlet portion includes
a gas inflow portion configured to inflow the ionization adjusting gas from outside,
a gas channel portion communicated with the gas inflow portion and formed inside along a longitudinal direction, and
a gas diverging portion communicated with the gas channel portion and to the direction of the closed loop, and having a slit shape.

9. The ion beam source according to claim 1, wherein the magnetic field unit is center-bent, and
both sides of magnetic field unit are inclined forward or backward.

10. The ion beam source according to claim 1, wherein the electrode unit includes
a reaction gas inflow portion communicated with outside, and
a reaction gas ejection portion communicated with the reaction gas inflow portion and the first side.

11. The ion beam source according to claim 10, wherein the reaction gas ejection portion includes a plurality of through-holes spaced at predetermined intervals or connected cut-out slits.

12. The ion beam source according to claim 1, wherein the magnetic pole portions are configured to form a plurality of closed loops.

13. The ion beam source according to claim 12, wherein the ion beam source is configured to control energy of an emitted ion beam by supplying different levels of power to each electrode unit that forms each of the closed loops.

14. An ion beam source, comprising:
a magnetic field unit including a first side facing a target object to be treated and a second side, the first side opened and the second side closed, the first side including a plurality of magnetic pole portions arranged at predetermined intervals with an N-pole and an S-pole alternatively or with same magnetic poles and configured to form a closed loop of plasma electrons; and
an electrode unit arranged at a lower end of the closed loop, wherein
the ion beam source is configured
to rotate the plasma electrons within a process chamber along the closed loop,
to generate plasma ions from an internal gas within the process chamber, and
to provide the plasma ions to the target object, and
intensities of magnetic fields generated at the magnetic pole portions are equivalent at points where the closed loop is formed.

15. The ion beam source according to claim 14, wherein the magnetic pole portions are configured to form a plurality of closed loops.

16. The ion beam source according to claim 15, wherein the ion beam source is configured to control energy of an emitted ion beam by supplying different levels of power to each electrode unit that forms each of the closed loops.

17. An ion beam source, comprising:
a magnetic field unit including a first side facing a target object to be treated and a second side, the first side opened and the second side closed, the first side including a plurality of magnetic pole portions arranged at predetermined intervals with an N-pole and an S-pole alternatively or with same magnetic poles and configured to form a closed loop of plasma electrons; and
an electrode unit arranged at a lower end of the closed loop, wherein
the ion beam source is configured
to rotate the plasma electrons within a process chamber along the closed loop,
to generate plasma ions from an internal gas within the process chamber, and
to provide the plasma ions to the target object,
the magnetic field unit is center-bent, and
both sides of magnetic field unit are inclined forward or backward.

18. The ion beam source according to claim 17, wherein the magnetic pole portions are configured to form a plurality of closed loops.

19. The ion beam source according to claim 18, wherein the ion beam source is configured to control energy of an emitted ion beam by supplying different levels of power to each electrode unit that forms each of the closed loops.

* * * * *